United States Patent
Okamoto et al.

(10) Patent No.: US 7,557,014 B2
(45) Date of Patent: Jul. 7, 2009

(54) SEMICONDUCTOR SYSTEM-IN-PACKAGE

(75) Inventors: Keishiro Okamoto, Kawasaki (JP); Takeshi Shioga, Kawasaki (JP); Osamu Taniguchi, Kawasaki (JP); Koji Omote, Kawasaki (JP); Yoshihiko Imanaka, Kawasaki (JP); Yasuo Yamagishi, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 193 days.

(21) Appl. No.: 11/600,211

(22) Filed: Nov. 16, 2006

(65) Prior Publication Data

US 2007/0065981 A1 Mar. 22, 2007

Related U.S. Application Data

(62) Division of application No. 10/092,525, filed on Mar. 8, 2002, now Pat. No. 7,176,556.

(30) Foreign Application Priority Data

Oct. 26, 2001 (JP) .............................. 2001-329687

(51) Int. Cl.
*H01L 21/00* (2006.01)
*H01L 21/20* (2006.01)
*H01L 21/4763* (2006.01)

(52) U.S. Cl. ...................... 438/396; 438/125; 438/381; 438/618; 257/E21.008; 257/E21.627

(58) Field of Classification Search ................. 438/106, 438/125, 386, 387, 393, 396, 618; 257/E21.008, 257/E21.597, E21.627
See application file for complete search history.

(56) References Cited

U.S. PATENT DOCUMENTS

| 5,229,647 | A | 7/1993 | Gnadinger |
| 5,382,827 | A | 1/1995 | Wang et al. |
| 5,751,068 | A | 5/1998 | McMahon et al. |

(Continued)

FOREIGN PATENT DOCUMENTS

JP 58-125859 A 7/1983

(Continued)

OTHER PUBLICATIONS

Japanese Office Action dated May 22, 2006 of corresponding Japanese Application No. 2001-329687.

*Primary Examiner*—Alexander G Ghyka
*Assistant Examiner*—Seahvosh J Nikmanesh
(74) *Attorney, Agent, or Firm*—Westerman, Hattori, Daniels & Adrian, LLP.

(57) ABSTRACT

A semiconductor apparatus comprises a support substrate having through holes filles with conductor adapted to a first pitch; a capacitor formed on or above said support substrate; a wiring layer formed on or above said support substrate, leading some of said through holes filles with conductor upwards through said capacitor, having branches, and having wires of a second pitch different from said first pitch; and plural semiconductor elements disposed on or above said wiring layer, having terminals adapted to the second pitch, and connected with said wiring layer via said terminals. A semiconductor apparatus, in which semiconductor elements having a narrow terminal pitch, a support having through wires at a wider pitch, and a capacitor are suitably electrically connected to realize the decoupling function with reduced inductance and large capacitance.

6 Claims, 5 Drawing Sheets

U.S. PATENT DOCUMENTS

| | | | |
|---|---|---|---|
| 5,883,428 A | 3/1999 | Kabumoto et al. | |
| 5,888,585 A | 3/1999 | Cuchiaro et al. | |
| 5,939,782 A | 8/1999 | Malladi | |
| 6,165,820 A * | 12/2000 | Pace | 438/125 |
| 6,503,778 B1 | 1/2003 | Yamauchi et al. | |
| 6,562,660 B1 | 5/2003 | Sakamoto et al. | |
| 6,611,419 B1 | 8/2003 | Chakravorty | |
| 6,669,489 B1 | 12/2003 | Dozier, II et al. | |
| 6,775,150 B1 * | 8/2004 | Chakravorty et al. | 361/761 |
| 2002/0076851 A1 * | 6/2002 | Eden et al. | 438/106 |
| 2002/0191366 A1 * | 12/2002 | Naito et al. | 361/302 |

FOREIGN PATENT DOCUMENTS

| | | |
|---|---|---|
| JP | 10-084082 A | 3/1998 |
| JP | 2000-031145 A | 1/2000 |
| JP | 2000-277689 A | 10/2000 |
| JP | 2001-177008 A | 6/2001 |
| JP | 2002-8942 A | 1/2002 |

* cited by examiner

US 7,557,014 B2

SEMICONDUCTOR SYSTEM-IN-PACKAGE

CROSS REFERENCE TO RELATED APPLICATION

This invention is based on and claims priority of Japanese patent application 2001-329687, filed on Oct. 26, 2001, the whole contents of which are incorporated herein by reference. This application is a divisional of prior application Ser. No. 10/092,525 filed Mar. 8, 2002, now U.S. Pat. No. 7,176,556, issued Feb. 13, 2007, the benefit of which is claimed under 35 U.S.C. § 120.

BACKGROUND OF THE INVENTION

1. Field of the Invention

The present invention relates to a semiconductor apparatus having plural parts packaged in one module, particularly a semiconductor apparatus having capacitors connected outside semiconductor elements for improving high frequency characteristics. It also relates to a production process thereof.

In this specification, in the case where plural semiconductor devices are arranged as a module to constitute a semiconductor apparatus, the respective semiconductor devices are called semiconductor elements. LSIs such as CPU are also called semiconductor elements.

2. Description of the Related Art

In recent years, the system-in-packages, in which existing chips are combined and connected at high densities to realize desired functions, are increasingly used. Compared with the case of integrating all functions on one chip, the development period can be shortened, and the cost performance can be improved.

Furthermore, semiconductor elements such as digital LSIs are advancing to be higher in speed and lower in power consumption. Because of the lower power consumption, the supply voltage declines. For example when the load impedance changes suddenly, the supply voltage is likely to vary. If the supply voltage varies, the semiconductor element is functionally disordered. So, the role of the decoupling capacitors for inhibiting the variation of supply voltage is important.

Since semiconductor elements are growing to be higher in speed, the influence of high frequency ripple is increasing. It is desired that the decoupling capacitors can also efficiently absorb the high frequency ripple component.

Because of the above, it is desired to lower the equivalent series resistance (ESR) and equivalent series inductance (ESL) of the capacitors. For this purpose, it is desired to minimize the wiring lengths between the semiconductor chips and the capacitors.

In the system-in-package, for connecting decoupling capacitors or the like to semiconductor chips or circuit substrate, there are known such techniques as (1) resin buildup technique, (2) thick ceramic film technique and (3) thin film multilayer technique.

(1) In the resin buildup technique, with a printed board used as the substrate, an insulation layer, passive element layer and wiring layer are built up on it, and capacitors are formed immediately below semiconductor chips and are connected by means of through wires. If an organic insulation layer is used as the insulation layer, the cost can be reduced, and the process can be carried out at low temperature. Furthermore, the thermal stress caused by heat cycles after mounting can be decreased, if the difference between the passive elements and the insulation layer in thermal expansion coefficient is kept small.

If capacitors are disposed immediately below semiconductor chips, ESL can be lowered, but the pitch of through wires in the capacitor support is as relatively large as 50 to 200 μm. The obtained capacitances of the capacitors are hundreds of picofarads per square centimeter, and this is insufficient as decoupling capacitors at high frequency.

(2) In the thick ceramic film technique, a low loss ceramic material is used as a substrate and an insulation layer, and a dielectric layer and a resistance layer are burned integrally. Capacitors can be formed immediately below semiconductor chips, and can be connected by means of through wires. The structure is excellent in parts-accommodating capability and low in dielectric loss (tanδ). So, the transmission loss at high frequency is small.

The obtained capacitance is tens of nanofarads per square centimeter, and the function as decoupling capacitors at high frequency is insufficient. Since the ceramics shrink in volume when burned, the dimensional dispersion becomes large. So, the through wire pitch in the capacitor support is as large as about 100 to 200 μm.

(3) In the thin film multilayer technique, a low dielectric constant resin is used as an insulation layer, and silicon or glass is used as a substrate. Resistances and capacitors can be formed in the layer, and the capacitors can be connected immediately below semiconductor chips by means of through wires. If the process is carried out at high temperature, capacitors having large capacitance of hundreds of nanofarads per square centimeter can be obtained.

If a semiconductor process is used, the through wire pitch in the support can be made as small as about 20 to 50 μm. The thermal stress caused by heat cycles after mounting can be decreased if the difference between passive elements and the insulation layer in thermal expansion coefficient is kept small.

Semiconductor elements are growing further higher in operation speed, lower in power consumption and larger in area. The transistors and wires in each semiconductor element become finer and finer. The number of terminals of a semiconductor element is also increasing, and the pitch between terminals is diminishing. There is a limit in narrowing the through wire pitch in the support of decoupling capacitors in accompany with the pitch of terminals of a semiconductor element.

If capacitors are mounted near, not immediately below, semiconductor elements, capacitors with large capacitance can be realized at low cost. However, since the wires must be routed longer, the high frequency characteristics become worse. It becomes difficult to install decoupling capacitors suitable for semiconductor elements acting at high speed at a frequency of more than GHz.

As described above, the system-in-package encounters a restriction in suitably connecting semiconductor elements, electronic parts such as capacitors, and a circuit substrate.

SUMMARY OF THE INVENTION

An object of this invention is to provide a semiconductor apparatus, in which semiconductor elements having a narrow terminal pitch, a support having through wires at a wider pitch, and capacitors are suitably electrically connected to realize a decoupling function with lowered inductance and large capacitance.

Another object of this invention is to provide a system-in-package that can be adapted to finer semiconductor elements.

A further object of this invention is to provide a semiconductor apparatus containing plural semiconductor elements to be used in such a system-in-package.

From one aspect of this invention, there is provided a semiconductor apparatus, comprising a support substrate having through holes filles with conductor in conformity with a first pitch, capacitors formed on or above said support substrate, a wiring layer formed on or above said support, leading some of said through wires upwards via said capacitors, having branches and having wires in conformity with a second pitch, and plural semiconductor elements disposed on or above said wiring layer, having terminals in conformity with the second pitch and connected with the wiring layer via said terminals.

From another aspect of this invention, there is provided a process for producing a semiconductor apparatus, comprising the steps of (a) forming through holes at a first pitch in a support substrate, (b) forming an insulation layer on side walls of said through holes, (c) filling through holes filled with conductor in the through holes provided with said insulation film, (d) forming capacitors connected with at least some of said through holes filled with conductor, and wires connected with said through holes filled with conductor or said capacitors and having a second pitch, on said support substrate, and (e) connecting plural semiconductor elements having terminals in conformity with said second pitch, with said wires.

In this way, a system-in-package having decoupling capacitors with good performance can be formed.

The wires on or above the support substrate of the capacitors can be used to connect the semiconductor elements with each other. It becomes easy to directly connect terminals disposed at a narrow pitch with each other.

DESCRIPTION OF THE PREFERRED EMBODIMENTS

An embodiment of this invention is described below in reference to the drawings.

Figure 2A:
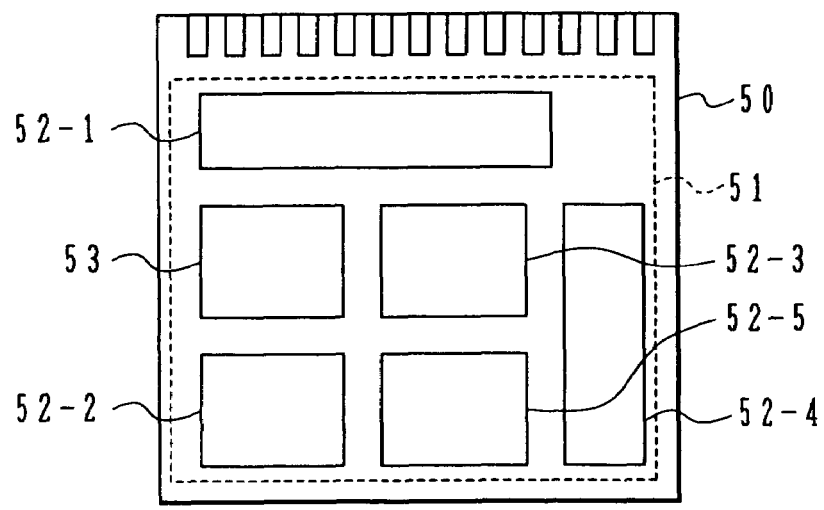
FIGS. 2A and 2B are a plan view and a partial sectional view schematically showing the constitution of a system-in-package.

FIG. 2A shows a constitution example of a system-in-package SiP. A circuit substrate 50 is mounted with circuit parts 52-1 through 52-5 including plural semiconductor elements.

The semiconductor elements are, for example, an arithmetic processing unit, digital signal processor, memory, high frequency IC, input/output interface, etc. Another circuit part 53 is, for example, a SAW filter.

On the circuit substrate 50, wires are formed, and between the circuit substrate 50 and the semiconductor elements 52-1 through 52-5 (and circuit part 53), an intermediate laminate 51 containing capacitors and wires is connected. A process for producing the intermediate laminate 51 containing capacitors and wires is described below.

Figure 1A:
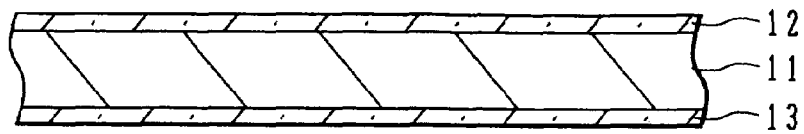
FIGS. 1A through 1T are sectional views showing a process for producing an intermediate laminate according to an embodiment of the present invention.

As shown in FIG. 1A, for example, a 6-inch Si wafer 11 is mirror-ground to have a thickness of 300 μm, and about 0.5 μm thick silicon oxide layers 12 and 13 are formed on both sides of the wafer by thermal oxidation.

Insulation layers such as silicon oxide layers can also be formed by means of low-pressure chemical vapor deposition or sputtering instead of thermal oxidation. The insulation layer should act as an etching stopper when the Si substrate is dry-etched, and is not limited to silicon oxide in material. For example, the insulating layer can be, an oxynitride layer, or a laminate of an oxide layer and a nitride layer.

Figure 1B:
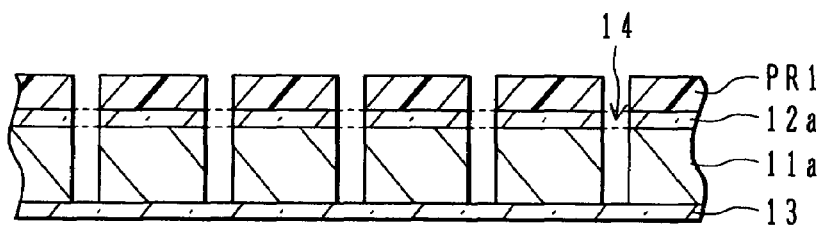

As shown in FIG. 1B, a resist mask PR1 made of a photo resist material is formed on the silicon oxide layer 12. Using the resist mask PR1 as an etching mask and $CF_4$ as a main etching gas, the silicon oxide layer 12 is etched to form openings 14. The openings 14 are formed according to the pattern of through wires to be formed. At this stage, the resist mask PR1 may be removed.

Then, using the resist mask PR1 or the patterned silicon oxide layer 12a as an etching mask, and using $SF_6$ and $C_4F_8$ as main etching gases, dry etching is carried out for anisotropic etching of the Si substrate 11. This etching automatically stops at the lower silicon oxide layer 13. As a result, via holes 14 through the silicone oxide layer 12a and the Si substrate 11a are formed. If the resist mask PR1 has not been removed, it is removed after completion of etching.

Figure 1C:
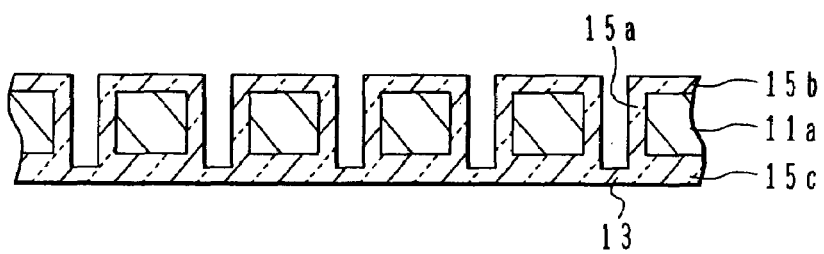

As shown in FIG. 1C, the Si substrate 11a is thermally oxidized to form a silicon oxide layer 15a of about 1 μm thick in the regions where the Si surface is exposed. The portions of the silicon oxide layer 13 remaining at the bottoms of the via holes, remain to have the original thickness (about 0.5 μm). The upper and lower silicon oxide layers on the Si substrate 11a are further oxidized to become silicon oxide layers 15b and 15c having a thickness of more than about 1 μm.

Figure 1D:
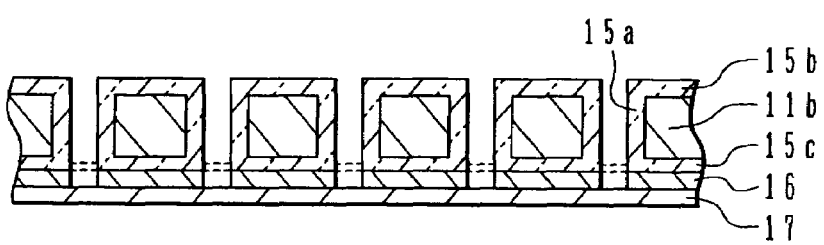

As shown in FIG. 1D, a Ti layer 16 of about 0.2 μm thick and a Pt layer 17 of about 1.0 μm thick are formed on the back surface of the substrate by sputtering. The Pt layer 17 is a seed layer for the plating to be carried out later. The Ti layer 16 is an adhesive layer for promoting the adhesion of the Pt layer 17 to the Si substrate. In the case where the seed layer has good adhesiveness, the adhesive layer may be omitted. The seed layer (and the adhesive layer) can also be formed by, for example, CVD or printing instead of sputtering.

Wet etching using a buffered hydrofluoric acid solution as an etchant is carried out to remove the portions of the silicon oxide layer 13 at the bottoms of the via holes. In this case, the other silicon oxide layers are also etched, but they are not removed entirely but partially remain due to the difference of thickness.

The etching with a buffered hydrofluoric acid solution is followed by wet etching using a diluted hydrofluoric acid nitric acid mixed solution as an etchant, to etch the portions of the Ti layer 16 exposed at the bottoms of the via holes. As a result, the Pt layer 17 is exposed at the bottoms of the via holes. The portions of the Ti layer are molten instantaneously when the etching starts. Even if the etchant has a nature of etching also the silicon oxide layers, the thickness of the silicon oxide layers removed while the Ti layer is etched is very limited. The silicon substrate 11a remains covered with the silicon oxide layers.

Dry etching may also be carried out instead of wet etching. Also in this case, even if the portions of the silicon oxide layer 13 at the bottoms of the via holes, are completely removed by etching, other silicon oxide layers 15a, 15b and 15c remain at least partially.

As a result, plural through holes can be formed in the Si substrate. At the bottoms of the through holes, the seed layer for plating is exposed, and the side walls of the through holes are covered with the insulation layer. The upper surface of the Si substrate is also covered with the insulation layer.

Figure 1E:
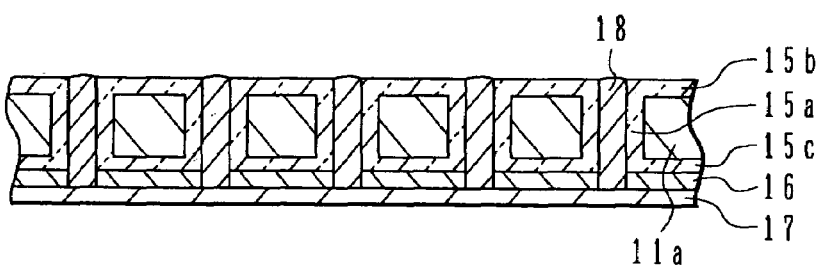

As shown in FIG. 1E, electroplating is carried out to form a Pt plating layer on the Pt layer 17 in the via holes 14, for forming via conductors 18 filling or packing the via holes.

In the case where the via holes are small in diameter, the through holes filled with conductor can also be formed by CVD instead of plating. In this case, the seed layer is not especially necessary, and for example, CVD can be carried out in the state of FIG. 1B or 1C.

Figure 1F:
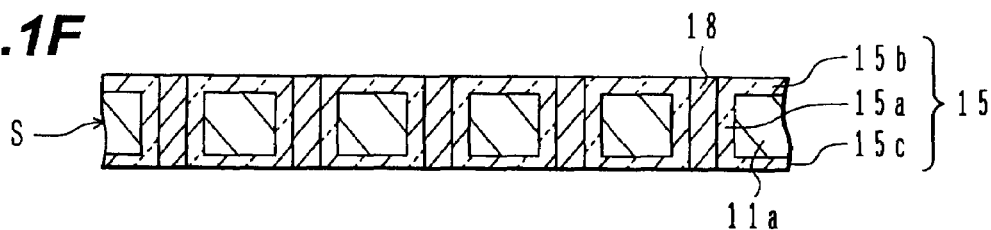

As shown in FIG. 1F, the upper surface of the Si substrate is flattened or planarized by chemical mechanical polishing (CMP). The upper surfaces of the through holes filled with conductor 18 become flush with the upper surface of the surrounding insulation layer 15b. Similarly, CMP is carried out also for the lower surface of the Si substrate, to expose the insulation layer 15c and the through holes filled with conductor 18. As a result, a support substrate S having through holes filled with conductor 18 can be obtained.

Figure 1G:
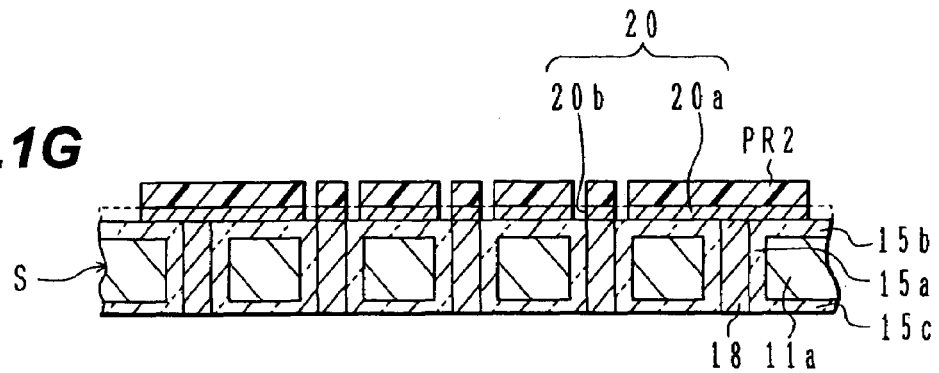

As shown in FIG. 1G, a Ti layer of about 0.1 μm thick and a Pt layer of about 0.2 μm thick are formed in this order as a lower electrode layer 20 on the surface of the support substrate S by sputtering at a substrate temperature of 400° C. A resist mask PR2 is formed on the lower electrode layer 20, and using the resist mask PR2 as a mask, the lower electrode layer 20 is patterned by milling using Ar ions. The milling can also be combined with etching. Then, the resist mask PR2 is removed.

Each of the lower electrodes 20 includes a first portion 20a having a wide-area and a cut-away portion and a second portion 20b within the cut-away portion. The second portion 20b is formed of the same electrode layer and destined to be an extracting electrode for wire leading in the cut-away portion, while being separated from the first portion.

Figure 1H:
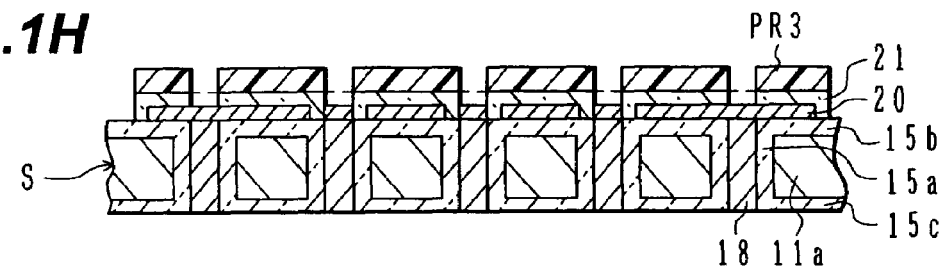

As shown in FIG. 1H, a (Ba, Sr)TiO$_3$ (BST) thin film 21 is formed on the substrate to cover the lower electrode 20, for example, at a substrate temperature of 550° C., at an Ar gas flow rate of 80 sccm, at an O$_2$ gas flow rate of 10 sccm, at a vacuum degree of 30 mTorr, with 300 W power applied for a processing time of 1 hour. Under these conditions, a 0.2 μm thick BST dielectric film having a dielectric constant of 500 and a dielectric loss of 2% can be obtained.

As the material having a high dielectric constant, for example, SrTiO$_3$ or BaTiO$_3$ can also be used. It is preferred to use an oxide dielectric containing at least one of Ba, Sr and Ti and having a high dielectric constant. The dielectric film can be formed by sputtering, or also sol-gel method or CVD.

On the dielectric film 21, a resist pattern PR3 is formed, and a buffered hydrofluoric acid solution (NH$_4$F:HF=6:1) is used for etching, to expose the surfaces of the leading electrodes and connection areas of the capacitor electrodes. Then, the resist pattern PR 3 is removed.

Figure 1I:
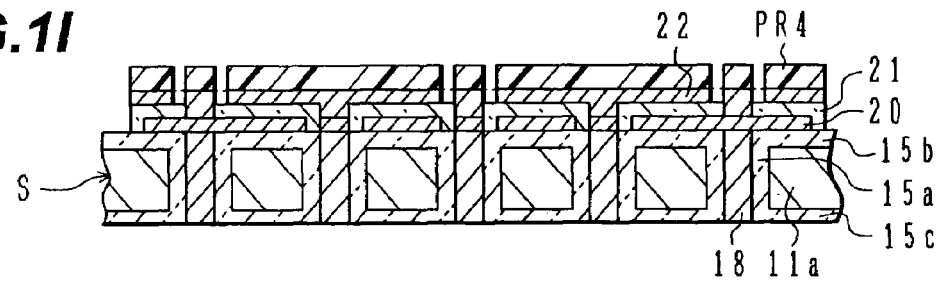

As shown in FIG. 1I, a Pt layer 22 of about 0.2 μm thick is formed by sputtering at a substrate temperature of 400° C. On the Pt layer 22, a resist pattern PR4 is formed. The Pt layer 22 is selectively removed by milling using Ar ions. As a result, an upper electrode pattern and a through conductor pattern are formed. Then, the resist pattern PR4 is removed.

As a result, the lower electrode and the upper electrode sandwiching a BST dielectric layer form a capacitor. Furthermore, in the region free from the dielectric layer, the lower electrodes and the upper electrodes form through holes filled with conductor. It is preferred that the capacitor electrodes in contact with the oxide dielectric film are made of oxidation resistant material such as Au or Pt, or such material as Pt, Ir, Ru, Pd which keep conductivity even if oxidized, or their oxides.

Figure 1J:
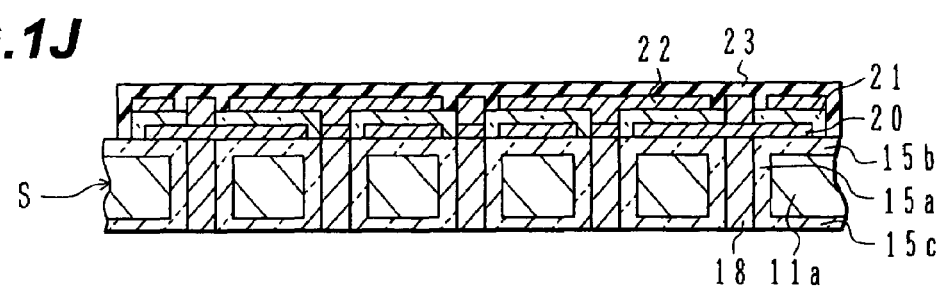

As shown in FIG. 1J, a photosensitive polyimide resin layer 23 is coated to cover the upper electrodes 22. It is desirable that the polyimide has a thermal expansion coefficient of 10 ppm/° C. or less in the in-plane direction. Then, the thermal stress by heat cycles after mounting can be decreased.

The photosensitive polyimide layer 23 is selectively exposed using, for example, a reticle and developed, to remove the polyimide layer in the wire-forming regions. The polyimide layer can also be patterned by any other method.

Figure 1K:
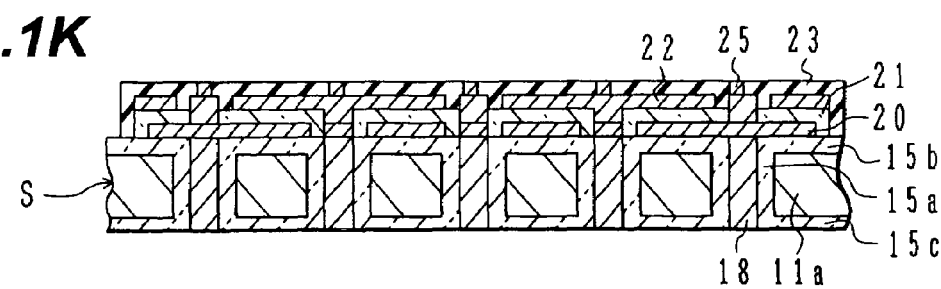

As shown in FIG. 1K, a Cu layer 25 is formed by electroplating on the surface of the Pt layer exposed within the openings of the polyimide layer 23. After capacitors using an oxide dielectric layer are formed, it is preferred to use Cu as wires. Then, as required, CMP is carried out to flatten or planarize the surface of the Cu layer 25 and the polyimide layer 23.

Figure 1L:
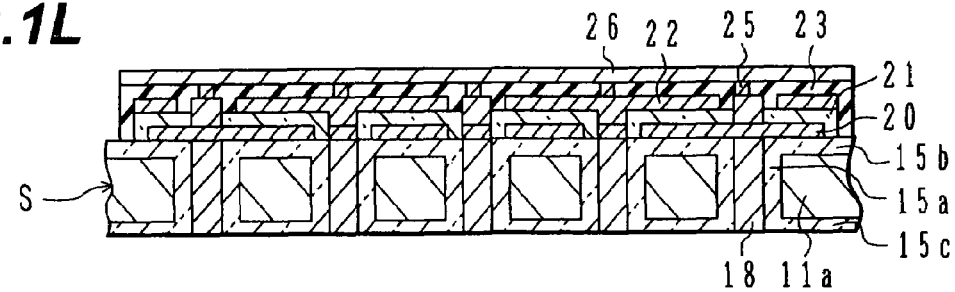
Figure 1M:
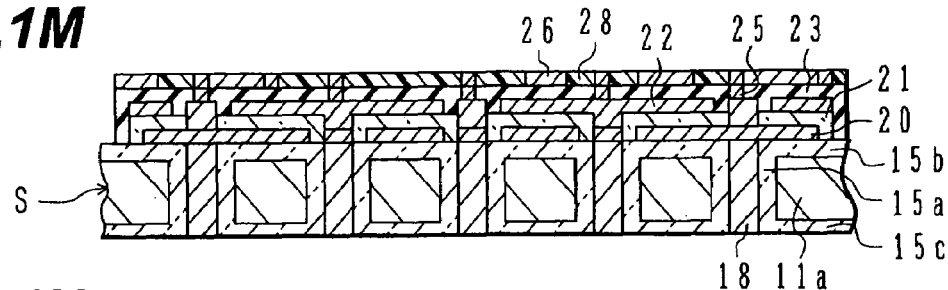

As shown in FIG. 1L, a Cu layer of about 0.2 μm thick is formed as a first wiring layer 26 on the polyimde layer 23 and the leading electrodes 25 by sputtering. The sputtering can be replaced with electroless plating or a combination of electroless plating and electroplating. A resist mask is formed, and ion milling is carried out to pattern the first wiring layer 26.

As shown in 1M, the pattern of the first wiring layer has a pitch and line width corresponding to, for example, one halves of the pitch and line width of the through holes filled with conductor 18. For example, if the through holes filled with conductor have a pitch of 50 mm and a line width of 20 mm, the pattern of the first wiring layer has a pitch of 25 mm and a line width of 10 mm.

After patterning the first wiring layer 26, a photosensitive polyimide resin is applied to form an insulation layer 28 for insulating the first wires 26 from each other. It is preferred that the polyimide resin has a thermal expansion coefficient of 10 ppm/° C. or less in the in-plane direction, like the aforesaid polyimide. In the case where the first wiring layer 26 is not flush with the polyimide layer 28, it is preferred to flatten them by CMP, etc. As a result, the first wiring layer pattern is formed.

Figure 1N:
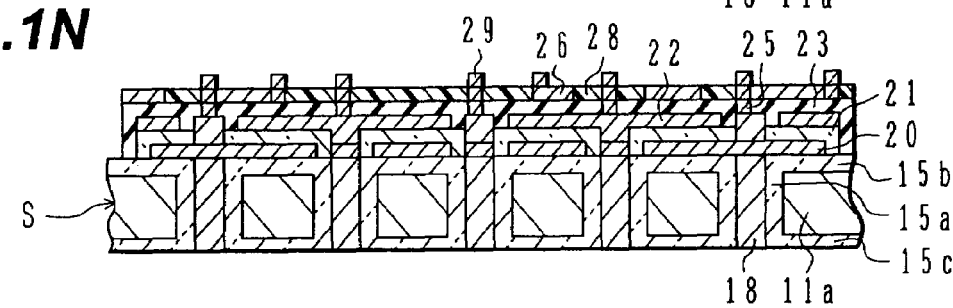

As shown in FIG. 1N, a connection wiring pattern 29 is formed according to the same method as described before.

Figure 1O:
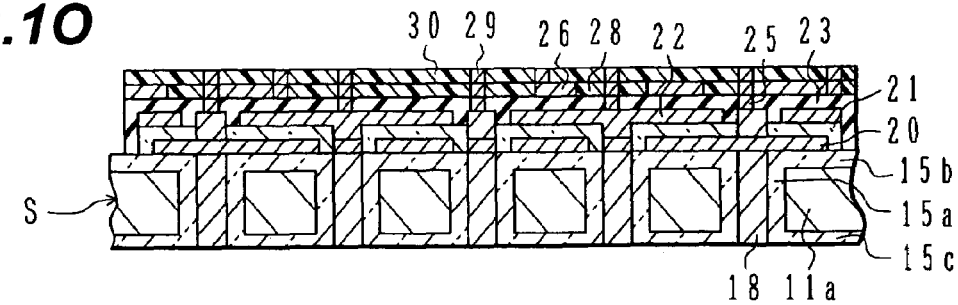

As shown in FIG. 1O, the spaces in the connection wiring pattern are filled with a polyimide layer 30 according to the same method as described before.

Figure 1P:
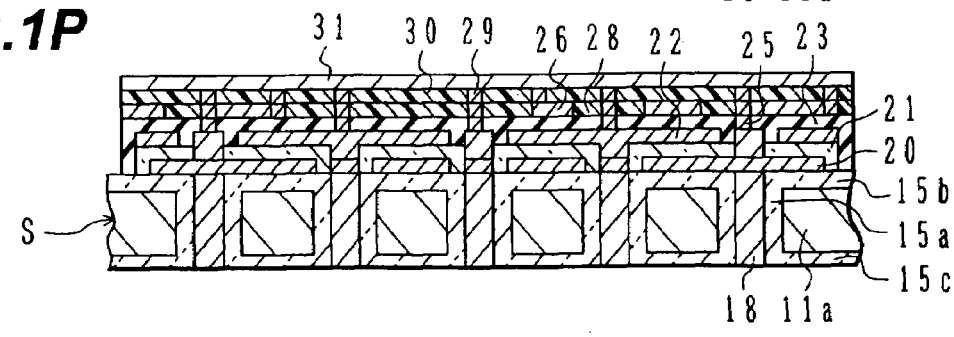

As shown in FIG. 1P, a Cu layer of about 0.2 μm thick is formed as a second wiring layer 31 according to the same method as described before.

Figure 1Q:
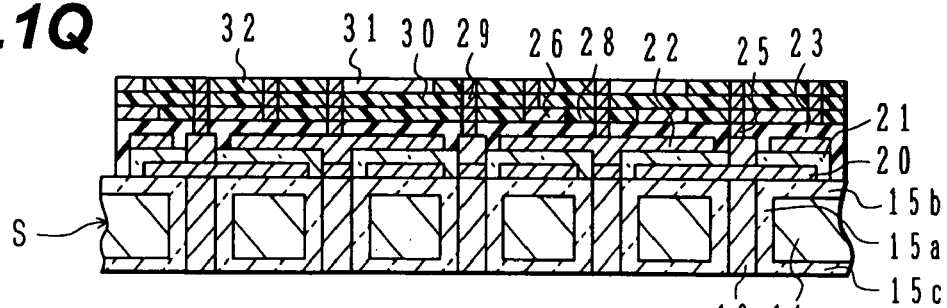

As shown in FIG. 1Q, the second wiring layer 31 is patterned according to the same method as described before, and the spaces in the pattern is filled with a polyimide insulation layer 32 as described before. As a result, a second wiring pattern is formed.

By repeating similar steps, a desired number of wiring layers can be formed.

Figure 1R:
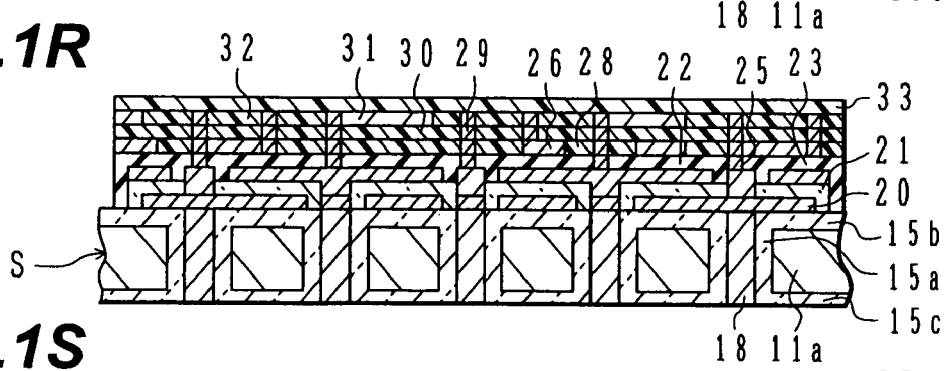

As shown in FIG. 1R, a polyimide layer is formed as a protective film 33 on the surface of the wiring layer according to the same method as described before. Openings are selectively formed in the photosensitive polyimide protective film 33 according to the same method as described before, for forming electrode-leading regions.

Figure 1S:
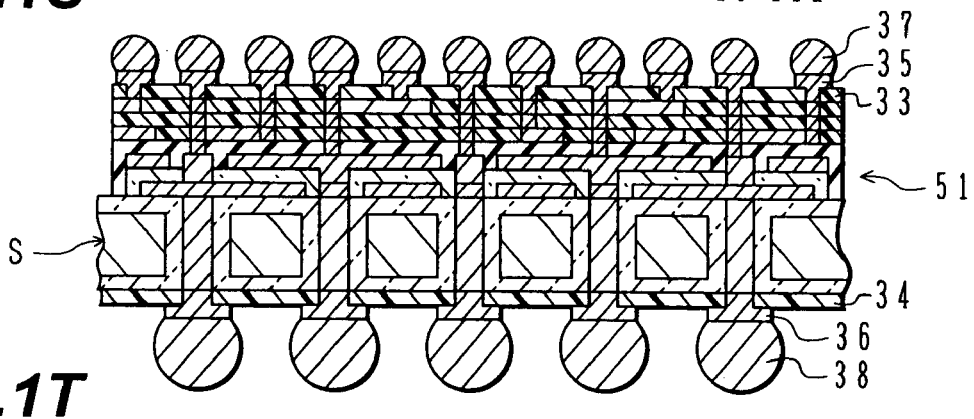

As shown in FIG. 1S, a Cr layer of about 0.05 μm thick, a Ni layer of about 2 μm thick and a Au layer of about 0.2 μm thick, in this order from the bottom, are laminated on the upper surface of the substrate, to cover the protective layer 33. The laminate is patterned to form electrode pads 35.

A protective film 34 and electrode pads 36 are formed also on the lower surface of the substrate according to the same method described before.

For example, Pb-5 wt % Sn solder is vapor-deposited through a metal mask on the formed electrode pads 35 and 36, and a flux is applied. They are heated and molten at 350° C., to form solder bumps 37 and 38 for connection. As a result, an intermediate laminate 51 having capacitors and wiring layers is formed.

Figure 1T:
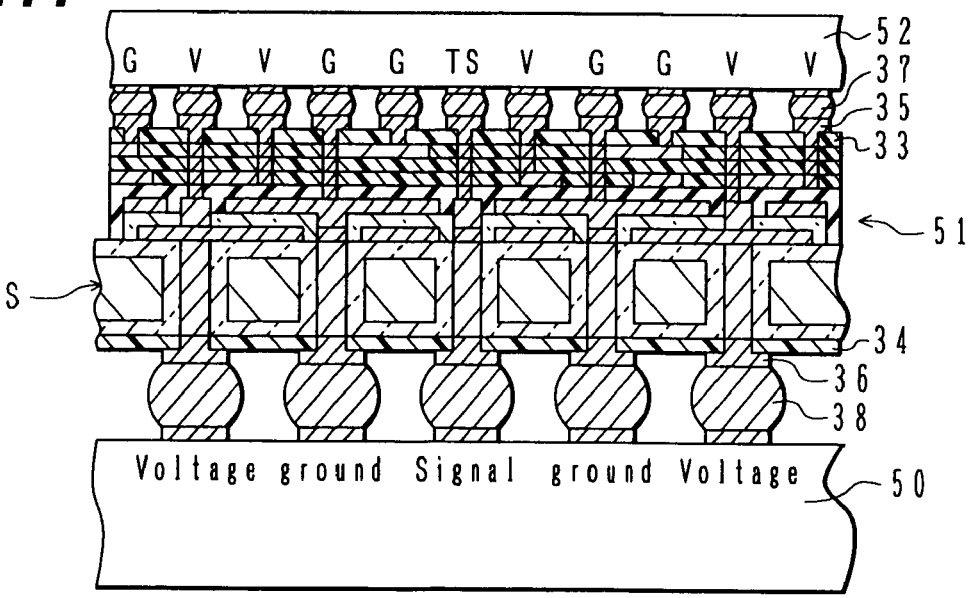

As shown in FIG. 1T, semiconductor elements 52 are overlaid on the intermediate laminate 51, and the bumps are molten for mounting them, to form a module. Only one semiconductor element is shown in the drawing, but as shown in FIG. 2A, plural semiconductor elements 52 are connected on the intermediate laminate 51. Then, the intermediate laminate 51 is connected on the circuit board 50. Alternatively, a module having plural circuit parts mounted on the intermediate laminate can also be offered as a product, and the user can mount it on a circuit board.

Figure 2B:
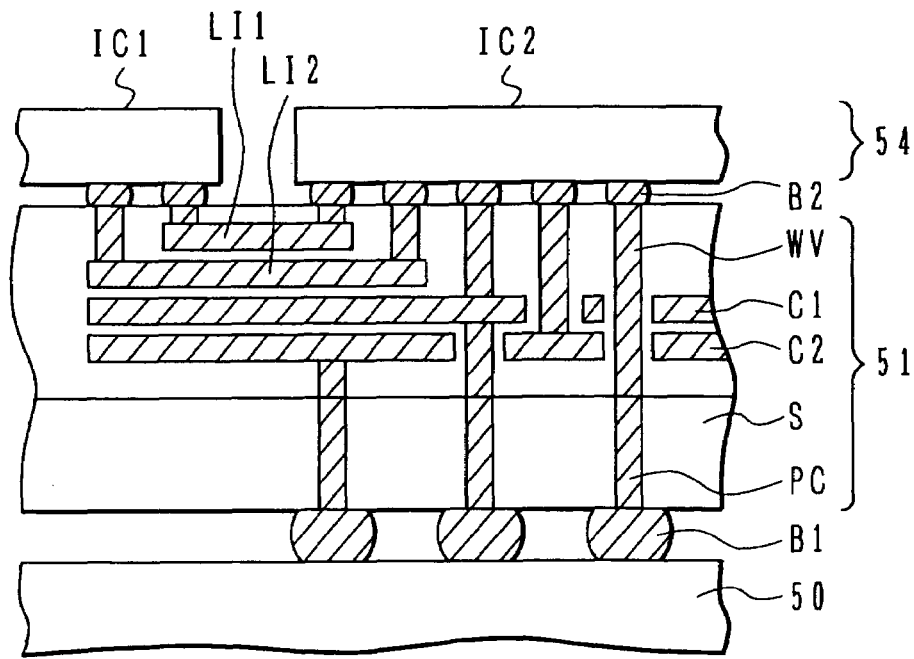

FIG. 2B schematically shows a portion of wires in a module. On the circuit board 50, the intermediate laminate 51 is disposed, and on the intermediate laminate 51, circuit parts 54 including plural semiconductor elements IC1 and IC2 are disposed. In the intermediate laminate 51, there are formed through holes filled with conductor PC formed in the support substrate S, vertical wires WV connected to the through holes filled with conductor PC, electrodes C1 and C2 of a capacitor connected to the vertical wires WV, and local wires LI1 and LI2 for connecting the semiconductor elements with each other.

The terminal pitch of the semiconductor elements IC1 and IC2 is narrower than the terminal pitch of the circuit board 50. If it is attempted to connect the terminals of the semiconductor elements IC1 and IC2 with each other via the wires on the circuit board 50, the wire pitch must be once expanded. If the wires in the intermediate laminate 51 are used, the semiconductor elements IC1 and IC2 can be connected with each other using shorter wires without changing the wire pitch or suppressing the expansion of the wire pitch small.

In the constitution shown in FIG. 1T, signal wire TS is arranged vertically from the semiconductor element 52 to the circuit board 50. Therefore, the wire length is short. Power wires V and G are connected to the semiconductor 52 from the circuit board 50 via each one electrode of a capacitor. The power wires respectively have a branch in the portion above the capacitor, to form a wire pitch adapted to the terminal pitch of the semiconductor element 52. The opposing capacitor electrodes form a decoupling capacitance between power wires.

With the above constitution, semiconductor elements having a narrow terminal pitch can be efficiently connected with a circuit board having a wide wire pitch. Furthermore, local wires for connecting the semiconductor elements with each other without passing through the circuit board can also be formed. Capacitors having sufficient capacitances can be formed to achieve the function of decoupling capacitors.

The present invention has been described along one embodiment, but is not limited thereto. For example, it will be obvious for a those skilled in the art, to make various modifications, improvements and combinations.

What we claim are:

1. A process for producing a semiconductor apparatus, comprising the steps of:
    (a) forming through holes at a first uniform pitch in a support substrate;
    (b) after said step (a), forming an insulation layer on side walls of said through holes;
    (c) filling through conductor in the through holes provided with said insulation film;
    (d) forming a capacitor connected with at least some of said through conductor, and wires connected with said through conductor or said capacitor and having a second uniform pitch narrower than said first uniform pitch, on said support substrate, and
    (e) connecting plural semiconductor elements having terminals in conformity with said second uniform pitch, with said wires.

2. The process for producing a semiconductor apparatus, according to claim 1, wherein said support substrate is a Si substrate;
    said step (a) thermally oxidizes both surfaces of the Si substrate to form silicon oxide films, and forms through holes passing from one of the silicon oxide films through the silicon substrate to reach the other silicon oxide film;
    said step (b) thermally oxidizes side walls of the through holes; and
    said step (c) forms a seed layer on back surface of the other silicon oxide film, and removes oxide films at bottoms of the through holes, to expose the seed layer, and forms a plating layer in the through holes using said seed layer as seed.

3. The process for producing a semiconductor apparatus, according to claim 2, wherein said step (d) forms a lower electrode layer, patterns the lower electrode layer to form signal wires and vacancies around them, forms an oxide dielectric film covering the lower electrode, patterns the oxide dielectric film to expose the signal wires and connecting portion of the lower electrode, forms an upper electrode layer covering the oxide dielectric film, and patterns the upper electrode layer to form signal wires, a wire connected with the lower electrode and vacancies around the wires.

4. The process for producing a semiconductor apparatus, according to claim 3, wherein said step (d) further alternately forms an insulation layer and a wiring layer to form a wiring layer adapted to a second pitch.

5. The process for producing a semiconductor apparatus, according to claim 4, wherein said step (d) forms a wiring layer containing wires connecting plural semiconductor elements with each other.

6. The process for producing a semiconductor apparatus, according to claim 1, further comprising the step of connecting said support substrate with a circuit board having wires adapted to said first pitch.

* * * * *